US012033857B2

(12) United States Patent
Jiang

(10) Patent No.: US 12,033,857 B2
(45) Date of Patent: Jul. 9, 2024

(54) PROCESSING METHOD FOR SEMICONDUCTOR SURFACE DEFECTS AND PREPARATION METHOD FOR SEMICONDUCTOR DEVICES

(71) Applicant: CHANGXIN MEMORY TECHNOLOGIES, INC., Hefei (CN)

(72) Inventor: Xianghong Jiang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 417 days.

(21) Appl. No.: 17/599,473

(22) PCT Filed: May 31, 2021

(86) PCT No.: PCT/CN2021/097458
§ 371 (c)(1),
(2) Date: Sep. 28, 2021

(87) PCT Pub. No.: WO2022/134474
PCT Pub. Date: Jun. 30, 2022

(65) Prior Publication Data
US 2023/0054142 A1 Feb. 23, 2023

(30) Foreign Application Priority Data
Dec. 23, 2020 (CN) .......................... 202011541065.9

(51) Int. Cl.
H01L 21/033 (2006.01)
H01L 21/02 (2006.01)
H01L 21/263 (2006.01)

(52) U.S. Cl.
CPC ...... *H01L 21/0337* (2013.01); *H01L 21/0217* (2013.01); *H01L 21/0332* (2013.01); *H01L 21/263* (2013.01)

(58) Field of Classification Search
None
See application file for complete search history.

(56) References Cited

U.S. PATENT DOCUMENTS 6,110,843 A  8/2000  Chien et al.

FOREIGN PATENT DOCUMENTS

| CN | 104220637 A | 12/2014 |
| CN | 104681483 A | 6/2015 |
| CN | 106292186 * | 1/2017 |

(Continued)

OTHER PUBLICATIONS

International Search Report cited in PCT/CN2021/097458 mailed Sep. 26, 2021, 8 pages.

Primary Examiner — Asok K Sarkar
(74) Attorney, Agent, or Firm — Kilpatrick Townsend & Stockton LLP

(57) ABSTRACT

The present disclosure provides a processing method for semiconductor surface defects and a preparation method for semiconductor devices. The processing method for semiconductor surface defects includes: placing a semiconductor device in a plasma processing device, the semiconductor device comprising a semiconductor substrate and deposition layers formed on the surface of the semiconductor substrate, bubbles being formed in the deposition layers; and plasma bombarding the surface of the deposition layer to break the bubbles, so that the surface of the deposition layer is flat.

15 Claims, 7 Drawing Sheets

(56) References Cited

FOREIGN PATENT DOCUMENTS

| | | |
|---|---|---|
| CN | 106292186 A | 1/2017 |
| CN | 109148263 A | 1/2019 |
| CN | 109585264 A | 4/2019 |
| EP | 0630989 A2 | 12/1994 |
| WO | 2013123143 A1 | 8/2013 |

* cited by examiner

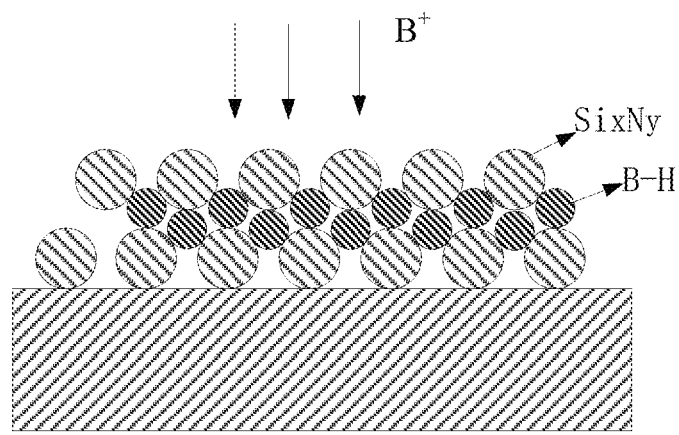

FIG. 11

Place a semiconductor device in a plasma processing device, the semiconductor device comprises a semiconductor substrate and deposition layers formed on the surface of the semiconductor substrate, bubbles are formed in the deposition layers Plasma bombard the surface of the deposition layer to break the bubbles, so that the surface of the deposition layer is flat

FIG. 12

PROCESSING METHOD FOR SEMICONDUCTOR SURFACE DEFECTS AND PREPARATION METHOD FOR SEMICONDUCTOR DEVICES

CROSS-REFERENCE TO RELATED APPLICATIONS

The present disclosure claims the priority to Chinese Patent Application 202011541065.9, titled "Processing method for semiconductor surface defects and preparation method for semiconductor devices", filed to China National Intellectual Property Administration on Dec. 23, 2020, which is incorporated herein by reference in its entirety.

TECHNICAL FIELD

The present disclosure relates to, but is not limited to, a processing method for semiconductor surface defects and a preparation method for semiconductor devices.

BACKGROUND

In the existing semiconductor device processes, during the deposition and formation of the thin film layer, due to the residual gas on the surface, gas is enveloped under the film layer, and protruding bubbles are formed on the surface of the film layer, resulting in uneven surface of the film layer. Especially during the hard mask layer process, when etching the film layer at the end of the process, etching the top of the protruding bubbles may cause sharp protrusions that may peel off and fall into the etching groove. As a result, after the semiconductor device is etched, particle shielding is caused. Furthermore, during the etching process, due to the formation of bubbles, the etching gas or solution goes into the bubbles and the etching width changes, and side etching may occur. As a result, the etching width becomes larger, which may affect the subsequent yield.

SUMMARY

The following is a summary of the subject matter detailed herein. This summary is not intended to limit the protection scope defined by the claims.

The present disclosure provides a processing method for semiconductor surface defects, which can make the surface of the semiconductor more flat and can improve the yield of semiconductor devices.

The processing method for semiconductor surface defects according to an embodiment of the present disclosure comprises: placing a semiconductor device in a plasma processing device, the semiconductor device comprising a semiconductor substrate and deposition layers formed on the surface of the semiconductor substrate, bubbles being formed in the deposition layers; and plasma bombarding the surface of the deposition layer to break the bubbles, so that the surface of the deposition layer is flat.

The present disclosure further provides a preparation method for semiconductor devices.

The preparation method for semiconductor devices according to an embodiment of the present disclosure comprises: providing a semiconductor substrate; forming, on the surface of the semiconductor substrate, a plurality of deposition layers arranged in a stacked manner, by plasma enhanced chemical vapor deposition, bubbles being formed in the deposition layers; when forming the plurality of deposition layers, after plasma bombarding at least the bottommost deposition layer to break the bubbles, forming other deposition layers on the surface of the bottommost deposition layer; and patterning the plurality of deposition layers.

According to some embodiments of the present disclosure, the plurality of deposition layers comprise at least one of silicon nitride layer, amorphous carbon layer, and silicon oxide layer.

According to the processing method for semiconductor surface defects according to the embodiment of the present disclosure, the surface of the deposition layers is plasma bombarded by the semiconductor plasma process to break the bubbles formed on the surface of the semiconductor device, so that the residual gas in the bubbles escapes. Therefore, the bubbles formed on the surface of the semiconductor device may be eliminated, so that the surface of the deposition layer is flat. In this way, in subsequent semiconductor preparation processes, for example during the deposition and etching on the surface of the semiconductor device, the formation of protrusions may be avoided so that the surface of the semiconductor device formed after deposition is more flat, and the problems of particle shielding after etching and side etching may also be avoided. Thus, the yield of subsequent products is improved.

After reading and understanding the drawings and detailed description, other aspects may be understood.

BRIEF DESCRIPTION OF THE DRAWINGS

The accompanying drawings, which are incorporated in and form a part of this specification, illustrate embodiments of the present disclosure and explain, together with the description, the principles of the present disclosure. In these drawings, like reference numerals identify like elements. The drawings to be described below are some, but not all, embodiments of the present disclosure. Other drawings may be obtained by a person of ordinary skill in the art in accordance with those drawings without paying any creative effort.

FIGS. 10-11 are schematic diagrams of the principle of a semiconductor surface processing method according to an embodiment of the disclosure;

FIG. 12 is a schematic flowchart of a processing method for semiconductor surface defects according to an embodiment of the present disclosure.

DETAILED DESCRIPTION

To make the purposes, technical solutions and advantages of the embodiments of the present disclosure clearer, the technical solutions in the embodiments of the present disclosure will be described clearly and completely with reference to the drawings in the embodiments of the present disclosure. Apparently, the embodiments to be described are some, but not all, embodiments of the present disclosure. Based on the embodiments of the present disclosure, all other embodiments obtained by a person of ordinary skill in the art without paying any creative effort should be included in the protection scope of the present disclosure. It is to be noted that the embodiments of the present disclosure and features in the embodiments may be combined if not conflict.

Hereinafter, a processing method for semiconductor surface defects according to the present disclosure will be described with reference to the accompanying drawings by specific implementations.

Figure 1:
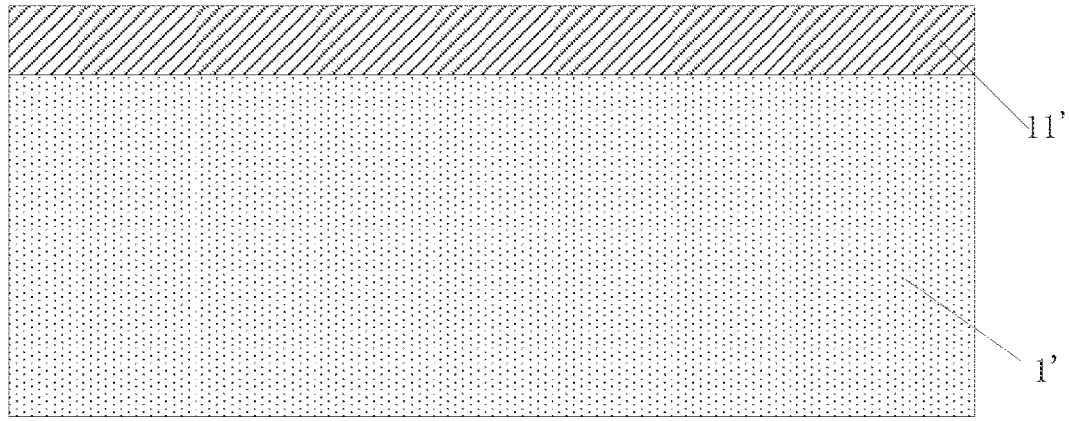
FIGS. 1-6 are process flow diagrams of steps for preparing a semiconductor device in the related technologies.
Figure 2:
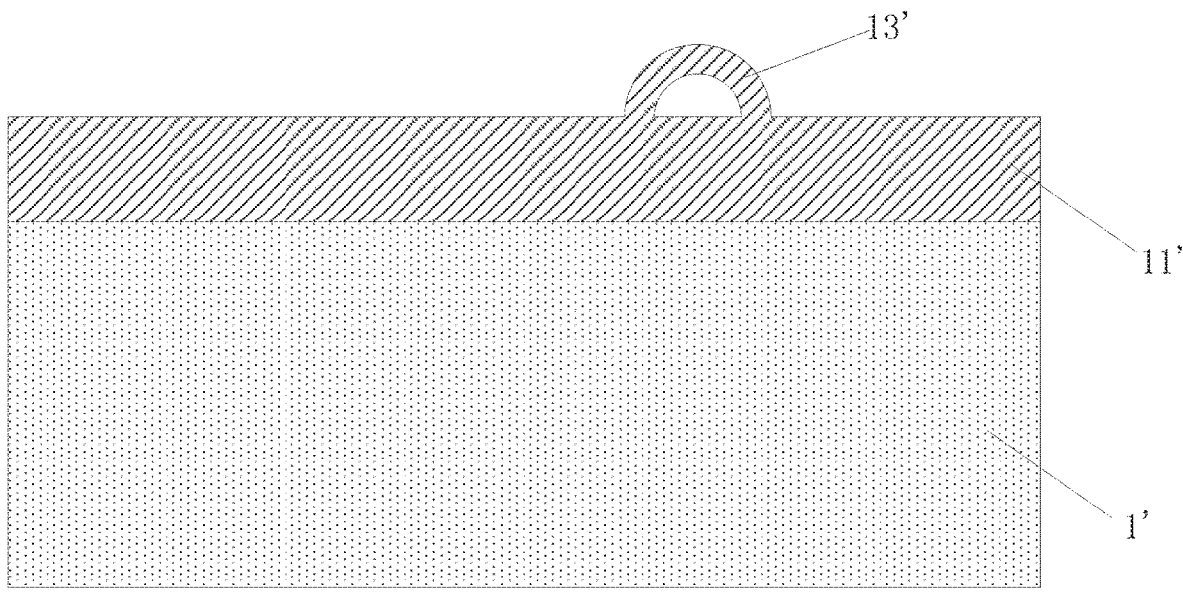
Figure 3:
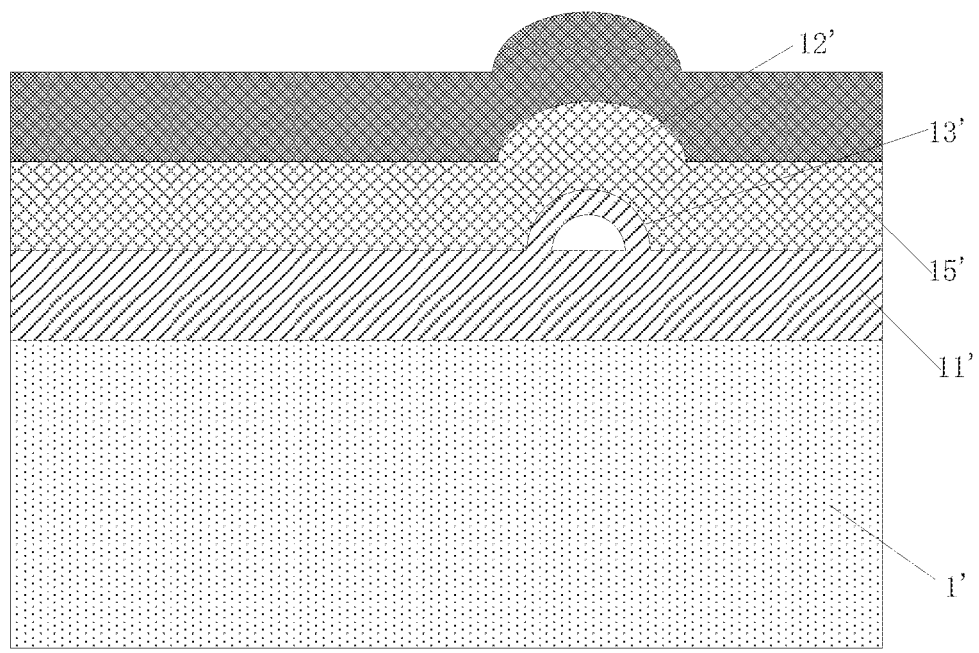
Figure 4:
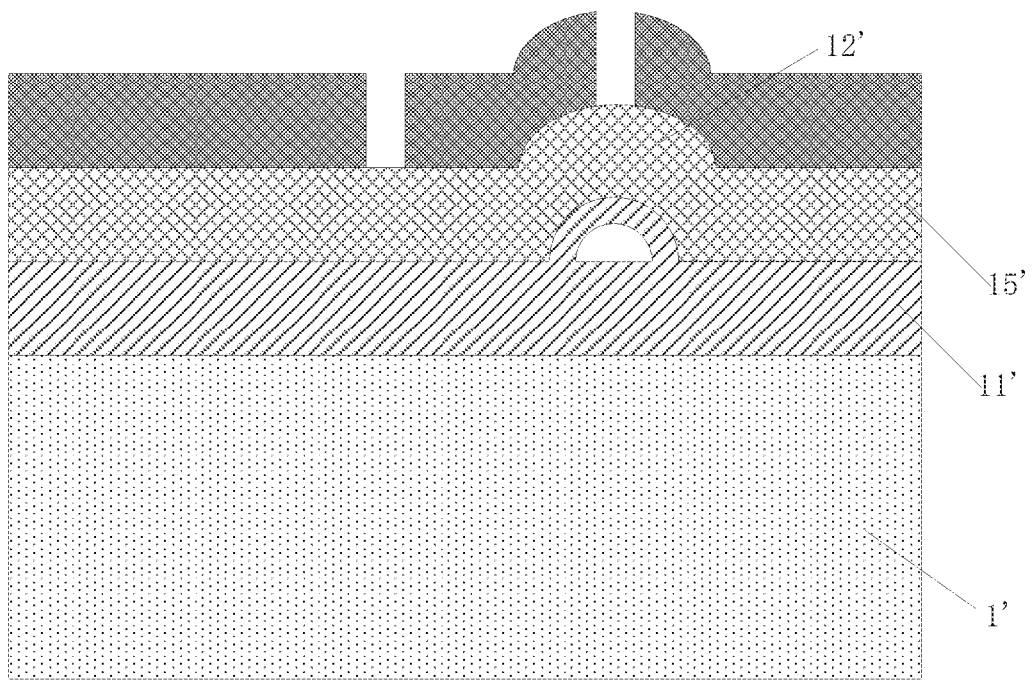
Figure 5:
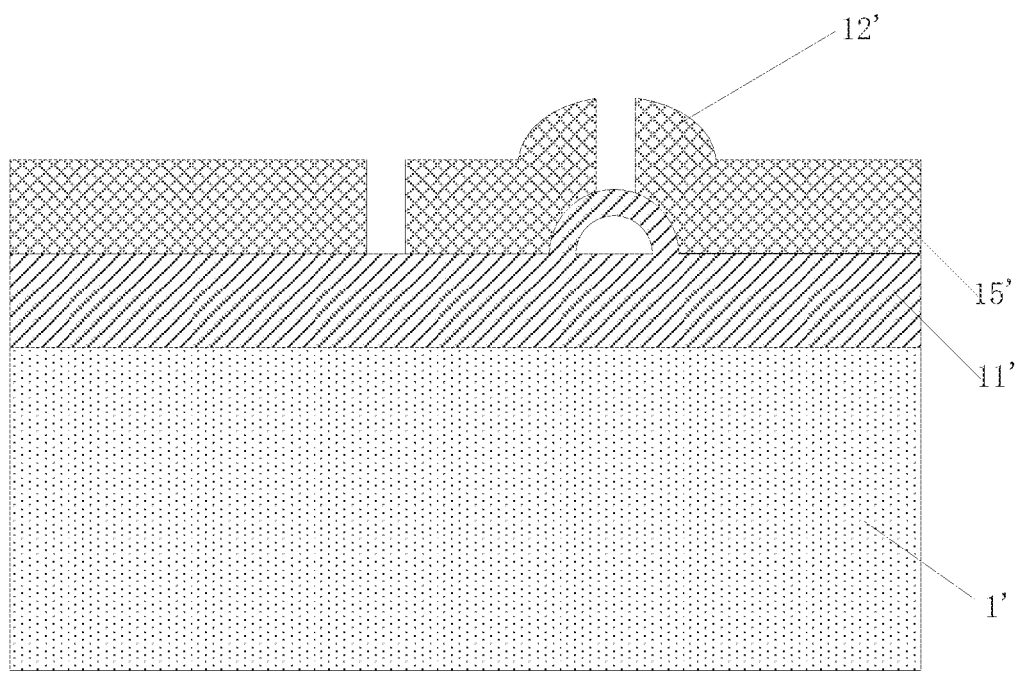
Figure 6:
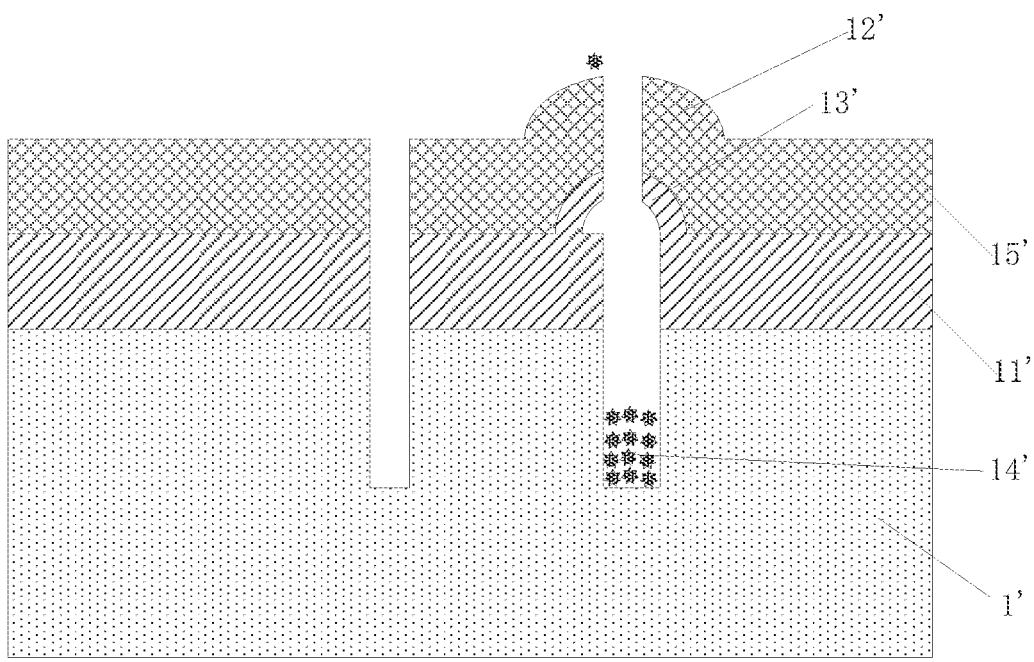

As shown in FIGS. 1-6, during the preparation process of semiconductor devices in the related technologies, for example, during the hard mask layer process, especially at the end of the process, since the formation rate of the thin film layer 11' on the semiconductor substrate 1' is relatively high and the gas formed in the process cannot be exhausted quickly, there will be residual gas on the surface of the formed thin film layer 11', causing the gas to be encapsulated under the thin film layer 11' to form protruding bubbles 13' on the surface of the thin film layer. As a result, during the subsequent deposition of other thin film layers 15', protrusions 12' that protrude from the surface are formed in the other thin film layers 15' located at the position of the bubbles 13'. Consequently, the surface of the formed semiconductor device is not flat. Moreover, during the subsequent etching, when the etching position is exactly at the position of the bubbles 13', since a certain space is formed in the bubbles 13', the etching gas or etching liquid enters the bubbles 13'. Due to the difference between the size of the bubbles 13' and the etching position, etching deviation occurs. For example, side etching shown in FIG. 6 occurs, resulting in abnormal subsequent yield. Moreover, as shown in FIG. 6, due to the protrusions 12' located above the bubbles, on the top of the etching groove, an upwardly inclined tip is formed during the etching process, which is not flat with the surface of the semiconductor device. During the etching process, particles 14' may be formed and may fall into the etching groove. Consequently, particle shielding is formed in the etching groove, resulting in abnormal yield of semiconductor devices.

The processing method for semiconductor surface defects according to the embodiment of the present disclosure will be described below with reference to the accompanying drawings.

As shown in FIG. 12, the processing method for semiconductor surface defects according to an embodiment of the present disclosure comprises: placing a semiconductor device in a plasma processing device, the semiconductor device comprising a semiconductor substrate 1 and deposition layers 11 formed on the surface of the semiconductor substrate 1, bubbles 13 being formed in the deposition layers 11; and plasma bombarding the surface of the deposition layer 11 to break the bubbles 13, so that the surface of the deposition layer 11 is flat.

The processing method for semiconductor surface defects according to the embodiments of the present disclosure is used for processing defects on the surface of the semiconductor device, on which deposition layers 11 are deposited, in the semiconductor manufacturing process, especially the semiconductor device formed in the hard mask process. The semiconductor device is placed in a plasma device, and the surface of the semiconductor device may be plasma treated by the plasma device.

Figure 7:
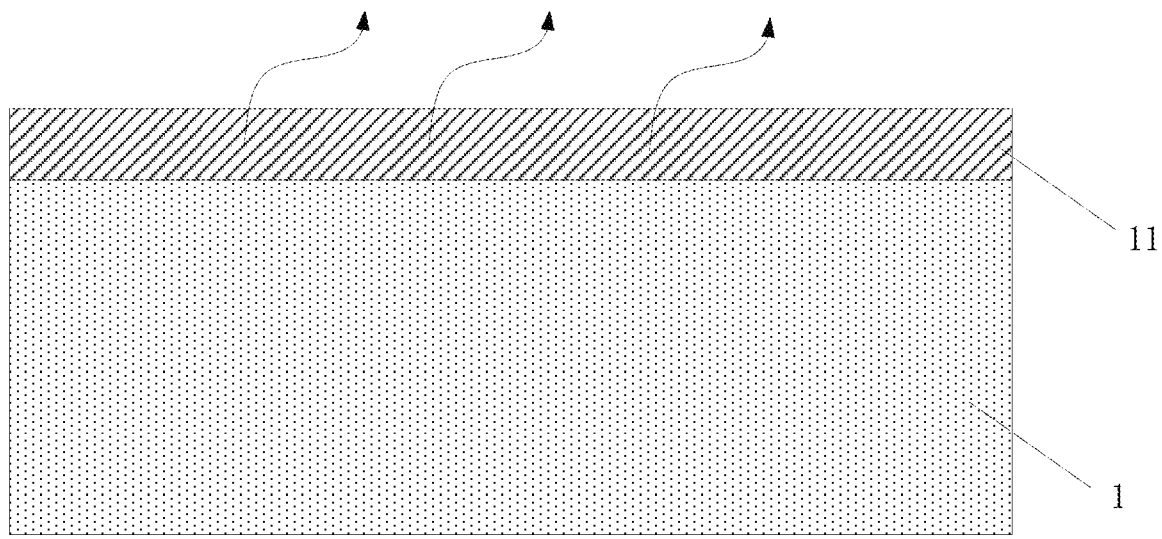
FIGS. 7-9 are cross-sectional process flow diagrams of steps of the processing method for semiconductor surface defects and the preparation method for semiconductor devices according to the embodiments of the present disclosure.
Figure 8:
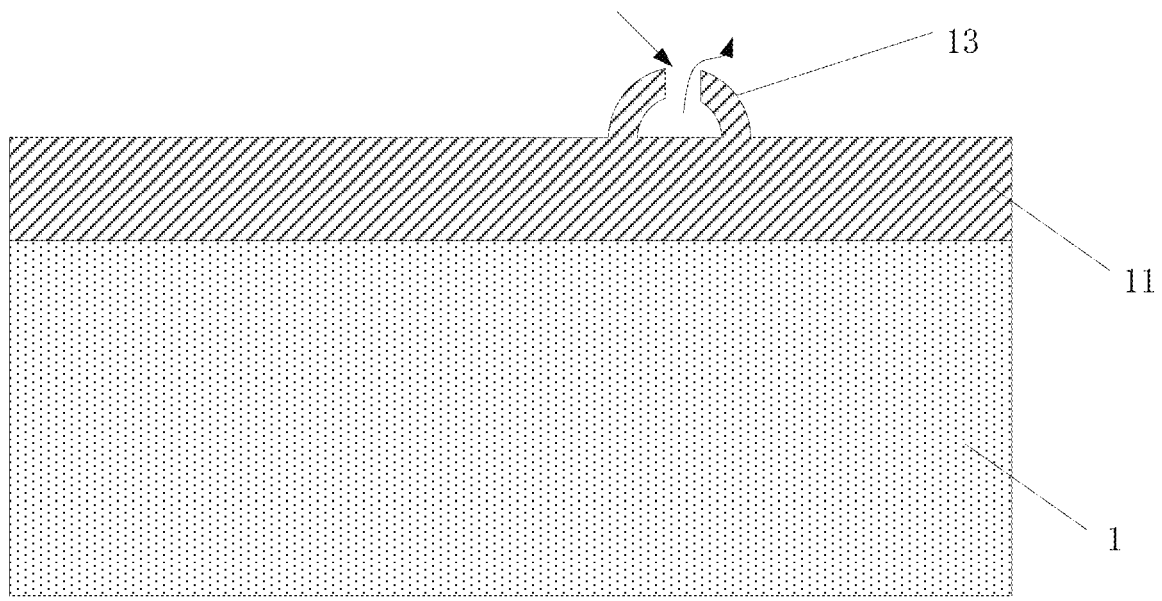

In some embodiments, as shown in FIGS. 7 and 8, the semiconductor device comprises a semiconductor substrate 1 and deposition layers 11 formed on the surface of the semiconductor substrate 1, bubbles 13 being formed in the deposition layers 11. the semiconductor substrate 1 may be made of silicon (Si), germanium (Ge), silicon germanium (GeSi), or silicon carbide (SiC); or may be made of silicon-on-insulator (SOI), germanium-on-insulator (GOI); or may be made of other material, for example III-V group compounds such as gallium arsenide.

In the preparation process of the semiconductor device, the deposition layers 11 are formed, by deposition, on the surface of the semiconductor substrate 1, and the desired semiconductor device is formed by processes such as etching. As described in the background, in the process of forming the deposition layers 11, due to the disparity between the deposition rate and the exhaust rate of the reaction-generated gas, there is residual gas on the surface of the deposition layers 11. As a result, bubbles 13 protruding from the surface of the deposition layers 11 are formed on the surface of the deposition layers 11.

The semiconductor device is placed in a plasma processing device. As shown in FIG. 8, the surface of the deposition layer 11 is plasma bombarded by a semiconductor plasma process to break the bubbles 13 formed on the surface of the semiconductor device, so that the residual gas in the bubbles 13 escape. Thus, the bubbles 13 formed on the surface of the semiconductor device can be eliminated, so that the surface of the deposition layer 11 is flat. In this way, in subsequent semiconductor preparation processes, for example during the deposition and etching on the surface of the semiconductor device, the formation of protrusions may be avoided so that the surface of the semiconductor device formed after deposition is more flat, and the problems of particle shielding after etching and side etching may also be avoided. Thus, the yield of subsequent products is improved.

In some embodiments of the present disclosure, the deposition layer 11 may be formed as silicon-containing compound layer containing silicon-hydrogen bonds. For example, the deposition layer 11 may be silicon nitride layer, silicon oxide layer, silicon oxynitride layer or amorphous silicon (a-Si) layer, etc. In the process of forming the deposition layer 11, the deposition layer 11 may be formed on the surface of the semiconductor substrate 1 by plasma enhanced chemical vapor deposition. The raw material gas is introduced into the process device, and after the reaction of the raw material gas, silicon-containing compound layer containing silicon-hydrogen bonds is formed on the surface of the semiconductor substrate 1. For example, the deposition layer 11 may be formed as silicon nitride layer. Specifically, silane gas and ammonia gas may be used as raw material during the deposition to form silicon nitride layer containing silicon-hydrogen bonds.

Figure 9:
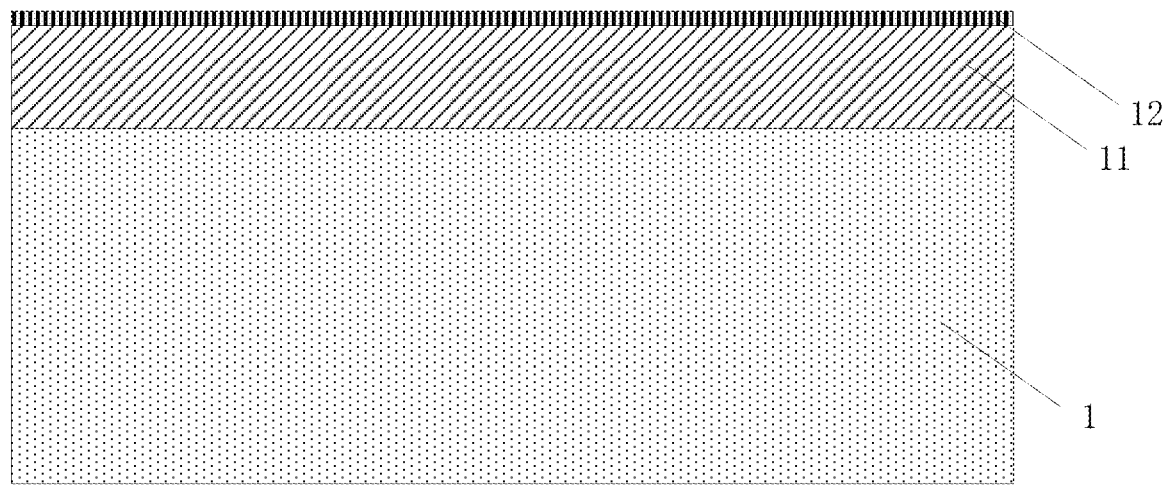
Figure 10:
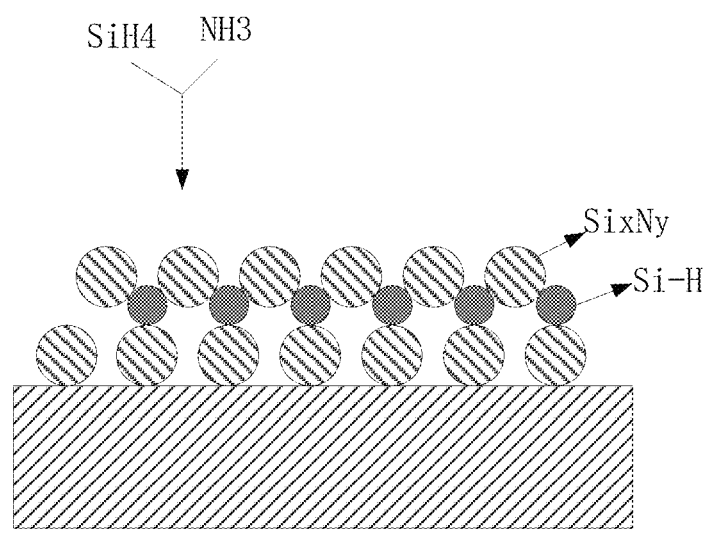

In this way, as shown in FIG. 9, when plasma bombarding the surface of the deposition layer 11, borane gas may be used for plasma bombardment, and the silicon-hydrogen bonds are broken to form boron-hydrogen bonds with stable bond energy. That is, the surface of the silicon-containing compound layer containing silicon-hydrogen bonds is plasma bombard with borane gas. As shown in FIGS. 10-11, the boron ions in the borane dissociate into plasma which bombards the surface of the deposition layer 11. The silicon-hydrogen bonds on the surface of the deposition layer 11 are broken and dissociated, and the silicon in the silicon-hydrogen bonds is substituted to form boron-hydrogen bonds with short bond length and high bond energy. In this way, the residual gas in the bubbles 13 on the surface of the deposition layer 11 escape and the surface of the deposition layer 11 becomes more flat. Moreover, a silicon compound layer 12 containing boron-hydrogen bonds may be formed on the surface of the deposition layer 11. For example, the silicon compound layer 12 containing boron-hydrogen bonds may be a silicon nitride layer containing boron-hydrogen bonds, so that the surface of the deposition layer 11 is made more compact, the defects on the surface of the deposition layer 11 are improved, the stability is better, and the dielectric constant and optical properties of the deposition layer 11 can be improved.

In some embodiments, when plasma bombarding the surface of the deposition layer 11, the flow rate of the borane gas is 2000-5000 sccm, the process temperature is 400-480° C., the process pressure is 2-5 Tor, and the radio frequency power is 300-800 W. Therefore, the dielectric constant and optical properties of the surface of the formed deposition layer 11 may be further improved by adjusting the flow rate of the borane gas, the process pressure of the plasma, the process temperature, and the radio frequency power and time during the plasma bombardment process, in order to make the surface of the formed deposition layer 11 more stable.

In some embodiments, in the step of forming a deposition layer 11 on the surface of the semiconductor substrate 1, silane gas and ammonia gas may be used as raw material gas to form the deposition layer 11; the bubbles 13 contain residual gas generated after the deposition layer 11 is formed; and after the bubbles 13 are broken, the processing method further comprises: pumping out the gas released after the bubbles 13 are broken.

In some embodiments, when plasma bombarding the surface of the deposition layer 11, inert gas may be used as carrier gas to avoid reaction with the deposition layer 11, and the flow rate of the inert gas is 1000-3000 sccm.

The following description will be made by taking, as an example, the deposition layer 11 formed in the hard mask layer process being silicon nitride layer.

In the process of forming the silicon nitride layer, silane gas and ammonia gas are used as raw material gas. The ratio of silane gas and ammonia gas may be $SiH_4/NH_3 \approx 1.5$, the process temperature may be 400° C.-480° C., the process pressure may be 2-7 Tor, and the radio frequency power may be 70-100 W. By appropriately reducing the process pressure, the pumping of the residual gas is accelerated.

At the end of the main deposition, borane gas is introduced as the subsequent processing gas. The flow rate of the borane gas is 2000-5000 sccm, the process temperature is 400-480° C., the process pressure is 2-5 Tor, and the radio frequency power is 300-800 W. In the presence of inert gas (for example argon, the flow rate of which is 1000-3000 sccm), boron ions dissociate into plasma which bombards the surface of the deposition layer 11 of the semiconductor device, so that the silicon-hydrogen bonds are broken, the boron ions are bonded to the broken hydrogen to form boron-hydrogen bonds with short bond length and high bond energy. The dissociated silicon is nitrided to form a large number of silicon-nitrogen bonds. The specific reaction will be described below.

Reaction Formulas:

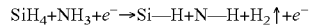

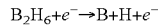

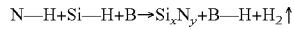

Accordingly, the residual gas in the bubbles 13 on the surface of the deposition layer 11 can escape, and the surface of the deposition layer 11 may be more compact and flat. Thus, the properties of the surface of the deposition layer 11 may be improved.

The preparation method for semiconductor devices according to the embodiment of the present disclosure will be described below with reference to the accompanying drawings.

Figure 13:
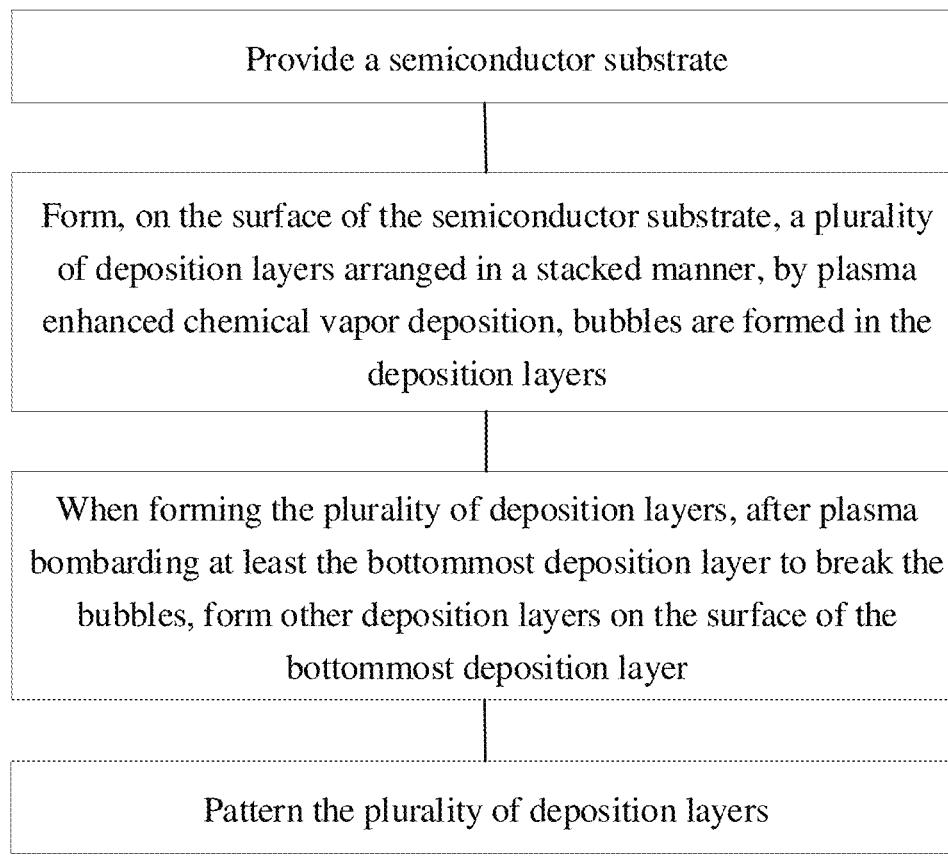
FIG. 13 is a schematic flowchart of a preparation method for semiconductor devices according to an embodiment of the present disclosure.

As shown in FIG. 13, the preparation method for semiconductor devices according to the embodiment of the present disclosure may comprise: providing a semiconductor substrate 1; forming, on the surface of the semiconductor substrate 1, a plurality of deposition layers 11 arranged in a stacked manner, by plasma enhanced chemical vapor deposition, bubbles 13 being formed in the deposition layers 11; when forming the plurality of deposition layers 11, after plasma bombarding at least the bottommost deposition layer to break the bubbles 13, forming other deposition layers on the surface of the bottommost deposition layer; and patterning the plurality of deposition layers 11.

In some embodiments, the semiconductor substrate 1 may be made of silicon (Si), germanium (Ge), silicon germanium (GeSi), or silicon carbide (SiC); or may be made of silicon-on-insulator (SOI), germanium-on-insulator (GOI); or may be made of other material, for example III-V group compounds such as gallium arsenide.

A plurality of deposition layers 11 arranged in a stacked manner may be formed on the surface of the semiconductor substrate 1 by plasma enhanced chemical vapor deposition, for example, during the hard mask layer process by using plasma-enhanced chemical vapor deposition. Bubbles 13 are formed on the surface of the deposition layer 11.

There may be one or a plurality of deposition layers 11. For example, when a plurality of deposition layers 11 are formed on the surface of the semiconductor substrate 1, the plurality of deposition layers 11 are stacked together and material for the plurality of deposition layers 11 is different. To avoid the formation of large protrusions on the surface of the finally formed semiconductor device and to ensure that the surface of the semiconductor device becomes more flat, at least the bottommost deposition layer 11 may be plasma bombarded. That is, the deposition layer 11, which is on the surface of the semiconductor substrate 1 and in contact with the surface of the semiconductor substrate 1, is plasma bombarded to break the bubbles on the surface of the deposition layer 11, so that the surface of the bottommost deposition layer 11 becomes more compact and more flat. Then, other deposition layers are deposited on the surface of the bottommost deposition layer 11. The other deposition layers are formed above the bottommost deposition layer 11 and material for the other deposition layers is different from that for the bottommost deposition layer 11. For example, the bottommost deposition layer 11 may be silicon nitride layer, and other deposition layers on the silicon nitride layer may be amorphous carbon layers, silicon oxide layers, or the like. Thus, not only the surface of the semiconductor device becomes more flat, and also side etching caused by the formation of bubbles 13 in the bottommost deposition layer 11 is avoided since the bottommost deposition layer 11 is formed on the surface of the semiconductor substrate 1.

Of course, it may be understood that, in order to further improve the flatness and compactness of the surface of the semiconductor device, after the deposition layers 11 are formed, the bubbles 13 formed on the surface of the deposition layers 11 may be removed by plasma bombardment. The number of plasma bombardments may be equal to or less than the number of layers of the plurality of deposition layers 11.

Finally, the deposition layers 11 are patterned. In this way, during the process of patterning the deposition layers 11, the surface of the semiconductor device formed is more flat, thereby avoiding particle shedding in the etching groove due to surface protrusions during the patterning process. In addition, the problem of abnormal width of the etching groove caused by side etching during the etching of the groove can also be avoided, and the product yield may be improved.

In some embodiments, the formation of the plurality of deposition layers 11 and the plasma bombardment of the deposition layers 11 are performed in a same reaction chamber. Therefore, the process of preparing the semiconductor device may be simplified, and the pollution to the semiconductor device can also be reduced. For example, when the plurality of deposition layers 11 are formed, the semiconductor substrate 1 is placed in a plasma device and formed by plasma enhanced chemical vapor deposition. After the main deposition of the bottommost deposition layer 11 is completed, plasma bombardment gas is introduced. The flow rate of the plasma bombardment gas is controlled, and the process temperature, process pressure, radio frequency power and other parameters of the plasma are adjusted to plasma bombard the formed deposition layers 11. In this way, the semiconductor device does not need to be taken out and placed in other devices, thereby reducing pollution.

In some examples of the present disclosure, the deposition layer 11 is formed as a mask layer. For example, the deposition layer 11 may be silicon nitride layer, silicon oxide layer, silicon oxynitride layer, or amorphous silicon (a-Si) layer. During the formation of the mask layer, due to the subsequent etching process, it is more necessary for the surface of the mask layer to be flat to improve the masking effect of the mask layer and the subsequent etching effect.

In some embodiments, the plurality of deposition layers 11 may comprise a first mask layer and a second mask layer; and the step of forming the plurality of deposition layers 11 comprises: forming the first mask layer on the surface of the semiconductor substrate 1, and plasma bombarding the surface of the first mask layer to break the bubbles 13 in the first mask layer; and forming the second mask layer on the surface of the first mask layer that is plasma bombarded, and plasma bombarding the surface of the second mask layer to break the bubbles 13 in the second mask layer. In this way, by plasma bombarding the first mask layer and the second mask layer respectively, the surface of the semiconductor device with the mask layer may be made more compact and flat, which is beneficial to improve the optical properties of the semiconductor device surface and the subsequent etching effect.

In some embodiments, the bottommost deposition layer 11 may be formed as a silicon compound layer 12 containing silicon-hydrogen bonds; when plasma bombarding the bottommost deposition layer 11, borane gas is used for the plasma bombardment; and the silicon-hydrogen bonds are broken to form boron-hydrogen bonds with stable bond energy. The silicon-containing compound layer containing silicon-hydrogen bonds is plasma bombard with borane gas. The boron ions in the borane dissociate into plasma which bombards the surface of the deposition layer 11. The silicon-hydrogen bonds on the surface of the deposition layer 11 are broken and dissociated, and the silicon in the silicon-hydrogen bonds is substituted to form boron-hydrogen bonds with short bond length and high bond energy. In this way, the surface of the deposition layer 11 becomes more compact and more flat. Moreover, due to the boron-hydrogen bonds which are more stable than the silicon-hydrogen bonds, the properties of the surface of the deposition layer 11 can be better.

In some embodiments, after plasma bombarding the bottommost deposition layer 11, a silicon compound layer 12 containing boron-hydrogen bonds is formed on the surface of the bottommost deposition layer 11. In the step of forming other deposition layers on the surface of the bottommost deposition layer 11, the other deposition layers are formed on the surface of the silicon compound layer 12 containing boron-hydrogen bonds, so that other deposition layers formed on the surface of the silicon compound layer 12 containing boron-hydrogen bonds can become more flat to further improve the properties of the semiconductor device.

Hereinafter, the preparation method for semiconductor devices according to the embodiment of the present disclosure will be described in detail by taking, as an example the deposition layer 11 formed in the hard mask layer process being a silicon nitride layer.

The bottommost deposition layer 11, that is, the silicon nitride layer, is formed on the surface of the semiconductor substrate 1 by plasma enhanced chemical vapor deposition. Specifically, silane gas and ammonia gas may be used as raw material gas. The ratio of silane gas and ammonia gas may be $SiH_4/NH_3 \approx 1.5$, the process temperature may be 400° C.-480° C., the process pressure may be 2-7 Tor, and the radio frequency power may be 70-100 W. By appropriately reducing the process pressure, the pumping of the residual gas is accelerated.

At the end of the main deposition, borane gas is introduced as the subsequent processing gas. The flow rate of the borane gas is 2000-5000 sccm, the process temperature is 400-480° C., the process pressure is 2-5 Tor, and the radio frequency power is 300-800 W. In the presence of inert gas (for example argon, the flow rate of which is 1000-3000 sccm), boron ions dissociate into plasma which bombards the surface of the deposition layer 11 of the semiconductor device, so that the silicon-hydrogen bonds are broken, the boron ions are bonded to the broken hydrogen to form boron-hydrogen bonds with short bond length and high bond energy. The dissociated silicon is nitrided to form a large number of silicon-nitrogen bonds. Thus, a more compact silicon nitride layer containing boron-hydrogen bonds may be formed on the surface of the deposition layer 11. Accordingly, the residual gas in the bubbles 13 on the surface of the deposition layer 11 can escape, and the surface of the deposition layer 11 may be more compact and more flat. Thus, the properties of the surface of the deposition layer 11 may be improved.

Then, other deposition layers 11 are subsequently formed on the surface of the silicon nitride layer containing boron-hydrogen bonds. The plurality of deposition layers 11 and the silicon nitride layer containing boron-hydrogen bonds are patterned to form an etching groove in the plurality of deposition layers 11 and the semiconductor substrate 1. Thus, side etching and particle shielding in the etching groove in the subsequent etching process can be avoided.

Those skilled in the art will readily think of other implementations of the present disclosure by considering the specification and practicing the disclosure disclosed herein. The present disclosure is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the appended claims.

It should be understood that the present disclosure is not limited to the precise structures that have been described above and shown in the drawings, and various modifications and changes may be made without departing from its scope. The scope of the present disclosure is defined only by the appended claims.

INDUSTRIAL APPLICABILITY

In the present disclosure, by plasma bombarding the surface of the deposition layer to eliminate the bubbles formed on the surface of the semiconductor device, the bubbles formed on the surface of the semiconductor device can be eliminated so that the surface of the deposition layer is flat. In this way, in subsequent semiconductor preparation processes, the formation of protrusions may be avoided so that the surface of the semiconductor device formed after deposition is more flat, and the problems of particle shielding after etching and side etching may also be avoided. Thus, the yield of subsequent products is improved.

The invention claimed is:

1. A processing method for semiconductor surface defects, comprising:
    placing a semiconductor device in a plasma processing device, the semiconductor device comprising a semiconductor substrate and deposition layers formed on a surface of the semiconductor substrate, bubbles being formed in the deposition layers, wherein at least one of the deposition layers is formed as a silicon-containing compound layer containing silicon-hydrogen bonds; and
    using borane gas for plasma bombarding a surface of the at least one of the deposition layers to break the bubbles, wherein the silicon-hydrogen bonds are broken to form boron-hydrogen bonds with stable bond energy, so that the surface of the at least one of the deposition layers is flat.

2. The processing method for semiconductor surface defects according to claim 1, wherein
    after plasma bombarding the surface of the at least one of the deposition layers, a silicon compound layer containing boron-hydrogen bonds is formed on the surface of the at least one of the deposition layers, and the silicon compound layer covers the at least one of the deposition layers.

3. The processing method for semiconductor surface defects according to claim 2, wherein
    the silicon compound layer containing boron-hydrogen bonds is a silicon nitride layer containing the boron-hydrogen bonds.

4. The processing method for semiconductor surface defects according to claim 1, wherein
    a flow rate of the borane gas is 2000-5000 sccm, a process temperature of the borane gas is 400-480° C., and a process pressure is 2-5 Tor.

5. The processing method for semiconductor surface defects according to claim 1, wherein
    a radio frequency power of the borane gas is 300-800 W.

6. The processing method for semiconductor surface defects according to claim 1, wherein
    in the step of forming the at least one of the deposition layers on the surface of the semiconductor substrate, silane gas and ammonia gas are raw material gases for forming the at least one of the deposition layers;
    the bubbles contain residual gas generated after the at least one of the deposition layers is formed;
    and after the bubbles are broken, the processing method further comprises:
    pumping out the residual gas released after the bubbles are broken.

7. The processing method for semiconductor surface defects according to claim 1, wherein
    the at least one of the deposition layer is one of a silicon nitride layer, a silicon oxide layer, a silicon oxynitride layer or an amorphous silicon layer.

8. The processing method for semiconductor surface defects according to claim 1, wherein
    when plasma bombarding the surface of the at least one of the deposition layers, inert gas is served as carrier gas.

9. The processing method for semiconductor surface defects according to claim 8, wherein
    a flow rate of the inert gas is 1000-3000 sccm.

10. A preparation method for semiconductor devices, comprising:
    providing a semiconductor substrate;
    forming, on a surface of the semiconductor substrate, a plurality of deposition layers arranged in a stacked manner, by plasma enhanced chemical vapor deposition, wherein a bottommost deposition layer of the plurality of deposition layers is formed as a silicon compound layer containing silicon-hydrogen bonds, and bubbles are formed on the bottommost deposition layer;
    when forming the plurality of deposition layers, carrying out plasma bombardment on the bottommost deposition layer using borane gas to break the bubbles and forming other deposition layers of the plurality of deposition layers on a surface of the bottommost deposition layer; and
    patterning the plurality of deposition layers.

11. The preparation method for semiconductor devices according to claim 10, wherein,
    after the plasma bombardment on the bottommost deposition layer, the silicon compound layer containing boron-hydrogen bonds is formed on the surface of the bottommost deposition layer; and when forming the other deposition layers on the surface of the bottommost deposition layer, the other deposition layers are formed on a surface of the silicon compound layer containing the boron-hydrogen bonds.

12. The preparation method for semiconductor devices according to claim 10, wherein
    the bottommost deposition layer is formed as a mask layer.

13. The preparation method for semiconductor devices according to claim 12, wherein
    the plurality of deposition layers comprise a first mask layer and a second mask layer; and forming the plurality of deposition layers comprises: forming the first mask layer on the surface of the semiconductor substrate; plasma bombarding a surface of the first mask layer to break the bubbles in the first mask layer; forming the second mask layer on the surface of the first mask layer that is plasma bombarded; and plasma bombarding a surface of the second mask layer to break the bubbles in the second mask layer.

14. The preparation method for semiconductor devices according to claim 10, wherein
    formation of the plurality of deposition layers and the plasma bombardment on the bottommost deposition layer are performed in a same reaction chamber.

15. The preparation method for semiconductor devices according to claim 10, wherein material for the other deposition layers is different from material for the bottommost deposition layer.

\* \* \* \* \*